(12) United States Patent
Ferrara et al.

(10) Patent No.: US 12,381,542 B2
(45) Date of Patent: Aug. 5, 2025

(54) SYSTEM FOR SELECTIVELY ADDING NOISE PEDESTAL TO GENERATED SIGNAL

(71) Applicant: Keysight Technologies, Inc., Santa Rosa, CA (US)

(72) Inventors: Andrew Ferrara, Santa Rosa, CA (US); Naveed Edalati, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 10 days.

(21) Appl. No.: 18/385,516

(22) Filed: Oct. 31, 2023

(65) Prior Publication Data

US 2025/0141437 A1   May 1, 2025

(51) Int. Cl.
  *H03K 5/01*  (2006.01)
  *G06F 1/04*  (2006.01)
  *H03B 29/00* (2006.01)

(52) U.S. Cl.
  CPC .............. *H03K 5/01* (2013.01); *G06F 1/04* (2013.01); *H03B 29/00* (2013.01)

(58) Field of Classification Search
  CPC .... G06F 1/04; G06F 1/08; G06F 1/10; H03K 5/01; H03B 29/00
  See application file for complete search history.

(56) References Cited

U.S. PATENT DOCUMENTS

2007/0185947 A1   8/2007   Yoshitake et al.
2010/0150218 A1*  6/2010   Yaginuma ........ G01R 31/31709
                                          375/226

FOREIGN PATENT DOCUMENTS

KR   10-2023-0117827 A   8/2023

OTHER PUBLICATIONS

English translation of KR20230117827A, 8 pgs.

* cited by examiner

*Primary Examiner* — Patrick O Neill (57) ABSTRACT

A reference system is provided for generating a clock signal with a tunable noise pedestal for driving a signal generator. The reference system includes a reference source configured to generate a reference signal and a multiplier chain, including a noise pedestal generator. The noise pedestal generator includes a noise pedestal attenuator configured to attenuate the reference signal to degrade a noise floor of the reference signal, a VGA configured to adjust the attenuated reference signal to a desired signal level, a bandpass filter configured to filter out excess noise from the adjusted reference signal to form a noise pedestal, and a switch arrangement configured to selectively input the reference signal to a first path including the noise pedestal attenuator and the VGA, and a second path bypassing the noise pedestal attenuator and the VGA. The clock signal includes the noise pedestal when the first path is selected.

20 Claims, 7 Drawing Sheets

SYSTEM FOR SELECTIVELY ADDING NOISE PEDESTAL TO GENERATED SIGNAL

BACKGROUND

Phase noise generation is critical for optioning signal sources, including direct digital synthesizer (DDS) based signal sources. This is particularly true in the pedestal region of a generated signal, which can include frequency offsets from a radio frequency (RF) carrier frequency between 1 kHz and 100 kHz. In DDS signal sources, for example, phase noise generation is currently provided using the internal modulation capability of the DDS signal source to introduce noise. However, this requires computing and processing resources within the DDS signal source itself, as well as any application-specific integrated circuits (ASICs) and field programmable gate arrays (FPGAs) used to achieve necessary modulation for phase noise.

Capabilities of signal sources, such as external frequency modulation, may also have to be disabled in order to generate the phase noise, which is undesirable since external frequency modulation (FM) or phase modulation (PM) are basic features that customers expect to have in signal sources. Additionally, this technique of adding noise to the signal generation engine (i.e., to the output of the signal generator) is inherently difficult to implement because it does not scale 20 log (N), and customers expect phase noise of the signal source to track 20 log (N) as frequency is scaled (by a factor of N). To achieve ideal scaling, complex algorithms must be adopted to add the appropriate level of noise. Currently, no algorithm has been able to achieve this flawlessly, and customers developing systems with signal sources continue to experience this non-ideal behavior.

Generally, phase locked loop (PLL) synthesizer-based signal sources inherently form noise pedestals, e.g., between 1 kHz and 100 kHz, when generating RF signals due to the nature of the PLL synthesizers. In comparison, DDS signal sources, for example, do not form noise pedestals when generating RF signals. Although this feature is typically considered to be advantageous with regard to overall performance, there are circumstances in which customers want to include noise pedestals for testing and/or comparison purposes. For example, pedestals are required in synthesized signals for compliance with export restrictions. Also, customers may want DDS signal sources that have the option to perform similar to signal sources that are not DDS in order to provide comparable results with the different types of equipment.

Accordingly, it is desirable for signal sources to provide the option of forming a noise pedestal, at different levels, when desired by the user, without compromising the ability to generate RF signals free from phase noise impairments. Such a noise pedestal generator may be used to form a desired noise profile in PLL synthesizer-based signal sources and DDS based signal sources, as well as Local Oscillators used in up and/or down conversion subsystems.

SUMMARY

According to a representative embodiment, a reference system is provided for generating a clock signal with a tunable noise pedestal for driving a signal generator. The reference system includes a reference source configured to generate a reference signal having a first frequency, and a multiplier chain configured to multiply the reference signal to produce a clock signal having a second frequency greater than the first frequency, and to output the clock signal to the signal generator. The multiplier chain includes a noise pedestal generator configured to selectively form a noise pedestal in the reference signal. The noise pedestal generator includes a noise pedestal attenuator configured to attenuate the reference signal to degrade a noise floor of the reference signal; a variable gain amplifier (VGA) configured to adjust the attenuated reference signal to a desired signal level to provide an adjusted reference signal able to drive a remainder of the multiplier chain at a target power, while maintaining the degraded noise floor; at least one bandpass filter configured to filter out excess noise from the adjusted reference signal to form the noise pedestal; and a switch arrangement configured to selectively input the reference signal to a first path including the noise pedestal attenuator and the VGA, and a second path bypassing the noise pedestal attenuator and the VGA. The clock signal, which is output to the signal generator, is based on the adjusted reference signal including the noise pedestal when the switch arrangement selectively inputs the reference signal to the first path, and the clock signal is based on the reference signal without the noise pedestal when the switch arrangement selectively inputs the reference signal to the second path.

According to another representative embodiment, a reference system is provided for generating a clock signal with a tunable noise pedestal for driving a signal generator. The reference system includes a reference source configured to generate a reference signal having a first frequency; and a noise pedestal generator configured to selectively form a noise pedestal in the reference signal. The noise pedestal generator includes a noise pedestal attenuator configured to attenuate the reference signal to degrade a noise floor of the reference signal; a VGA configured to adjust the attenuated reference signal to a desired signal level to provide an adjusted reference signal able to drive a multiplier chain at a target power, while maintaining the degraded noise floor; a bandpass filter configured to filter out excess noise from the adjusted reference signal to form the noise pedestal; and a switch arrangement configured to selectively input the reference signal to a first path including the noise pedestal attenuator and the VGA, and a second path bypassing the noise pedestal attenuator and the VGA, and to selectively output one of the adjusted reference signal from the first path and the reference signal from the second path to the signal generator, where the adjusted reference signal includes the noise pedestal; and a controller configured to control the switch arrangement to select one of the first path or the second path.

According to another representative embodiment, a signal generating system includes a clock reference system configured to generate a clock signal with a tunable noise pedestal for driving a signal generator; and a signal generator configured to generate a radio frequency (RF) signal responsive to the clock signal from the clock reference system, the RF signal including the tunable noise pedestal from the clock signal. The reference system includes a reference source configured to generate a reference signal having a first frequency; and a multiplier chain configured to multiply the reference signal to produce the clock signal having a second frequency greater than the first frequency. The multiplier chain includes a noise pedestal generator configured to selectively form a noise pedestal in the reference signal. The noise pedestal generator includes a noise pedestal attenuator configured to attenuate the reference signal to degrade a noise floor of the reference signal; a VGA configured to adjust the attenuated reference signal to a desired signal level to provide an adjusted reference signal able to drive a remainder of the multiplier chain at a target power, while maintaining the degraded noise floor; a bandpass filter configured to filter out excess noise from the adjusted reference signal to form the noise pedestal; and a switch arrangement configured to selectively input the reference signal to a first path including the noise pedestal attenuator and the VGA, and a second path bypassing the noise pedestal attenuator and the VGA, where the clock signal is based on the adjusted reference signal including the noise pedestal when the switch arrangement selectively inputs the reference signal to the first path, and the clock signal is based on the reference signal without the noise pedestal when the switch arrangement selectively inputs the reference signal to the second path.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, various embodiments provide techniques for generating tunable noise directly in a signal generator. Conventional implementations for simulating noise consume significant processing and computing resources within the signal generator and supporting digital circuits, render certain capabilities of the signal generator unusable, require complex algorithms, and struggle to scale ideally.

In comparison, the various embodiments herein are applied directly to the reference clock of the signal generator, which is a major source of phase noise. That is, a noise pedestal generator circuit is added in the reference clock itself to form a finely adjustable phase noise pedestal. The phase noise of the reference clock is then directly reflected to the output of the signal generator to include the phase noise pedestal. Thus, the phase noise pedestal is formed without complex algorithms or otherwise consuming any processing or computing resources, and scales ideally (20 log N) over frequency. Also, the phase noise pedestal may be adjusted with high resolution (e.g., 0.1 dB resolution) by simple digital controls.

Figure 1:
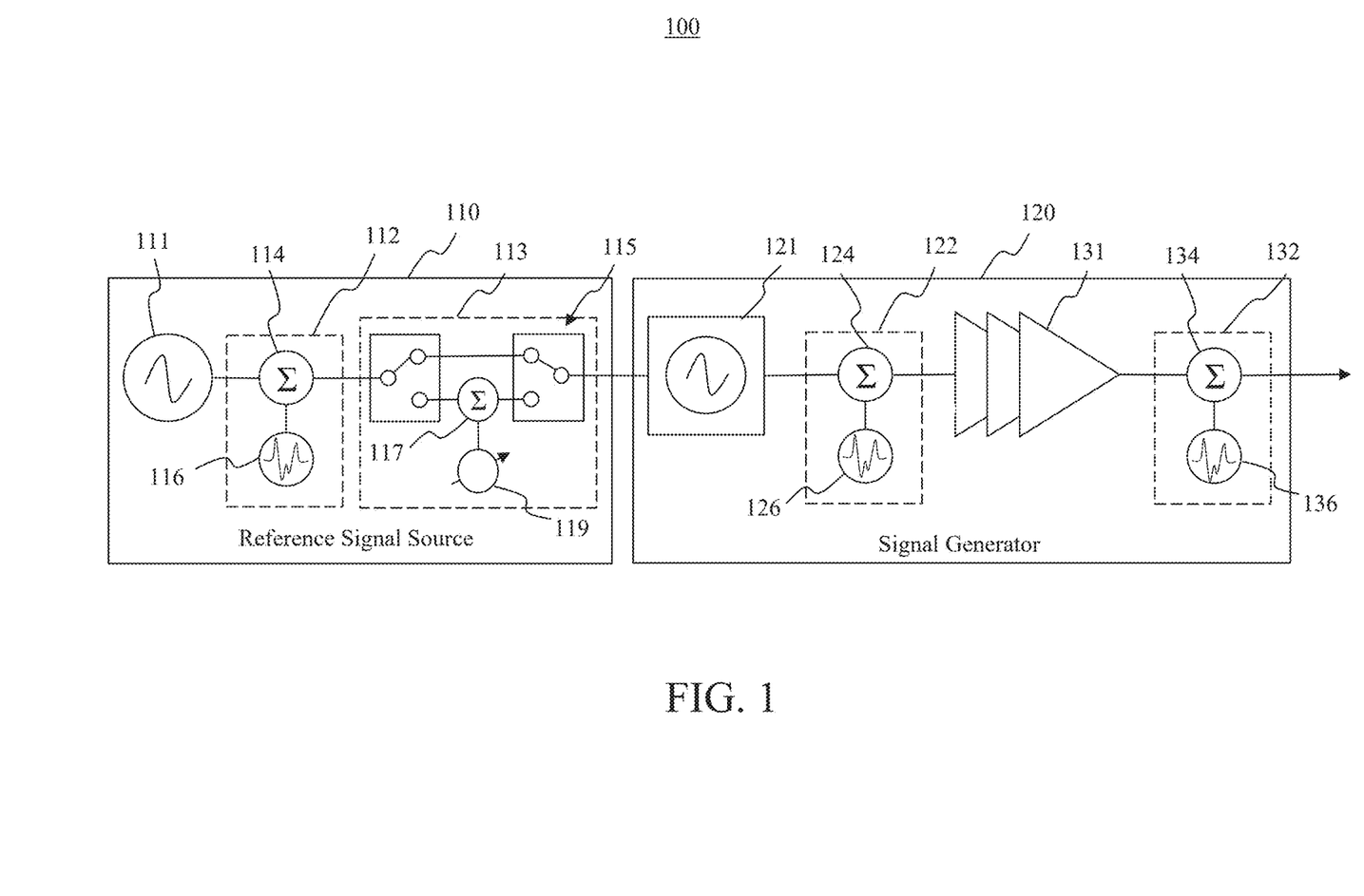
FIG. 1 is a simplified block diagram of a signal generating system with a signal generator and a reference system for generating a clock signal with tunable noise, according to a representative embodiment.

FIG. 1 is a simplified block diagram of a signal generating system with a signal generator and a reference system for generating a clock signal with tunable noise, according to a representative embodiment. The block diagram indicates absolute and residual noise sources, for purposes of illustration.

Referring to FIG. 1, signal generating system 100 includes clock reference system 110 and signal generator 120. The clock reference system 110 generates a clock signal, and includes a reference signal source 111, which introduces clock absolute phase noise 112, indicated by adder 114 and absolute phase noise source 116. The clock absolute phase noise 112 includes flicker noise and random walk expressed through the Leeson effect, as well as thermal noise. In the depicted embodiment, the clock reference system 110 also includes a noise pedestal generator 113 configured to selectively form a tunable phase noise pedestal in the clock signal. The pedestal generator 113 includes a switch arrangement 115 configured to selectively add a noise pedestal generated by noise pedestal source 119 to the reference signal, indicated by adder 117. The tunable phase noise pedestal also may be set to different noise levels, selectable by a user. Alternatively, the switching arrangement 115 may be operated to bypass the addition of a noise pedestal.

The signal generator 120 generates an RF signal in response to the clock signal from the clock reference system 110, and includes signal source 121 and output chain 131. The signal source 121 introduces signal source residual phase noise 122, indicated by adder 124 and residual phase noise source 126. The signal source 121 may be a Direct Digital Synthesis (DDS) based signal source, for example, such as a DDS application specific integrated circuit (ASIC). Alternatively, the signal source 121 may be a PLL synthesizer based signal source or a Local Oscillator (LO) for an up/down converter, for example. The output chain 131 introduces output chain residual phase noise 132, indicated by adder 134 and residual phase noise source 136. Each of the signal source residual phase noise 122 and the chain residual phase noise 132, which includes flicker noise and thermal noise. The clock reference system 110 is implemented according to representative embodiments to output the clock signal to the signal generator 120 that selectively includes no phase noise pedestal, as in some conventional signal sources, or includes a tunable phase noise pedestal via the noise pedestal generator 113 when selected by the user, as discussed further below.

As discussed above, adding a phase noise pedestal may be of particular interest when the signal source 121 is a DDS signal source, for example, since signals output by DDS signal sources do not include a prominent noise pedestals. Accordingly, the examples in FIGS. 2 and 3 are directed to DDS signal sources.

Figure 2:
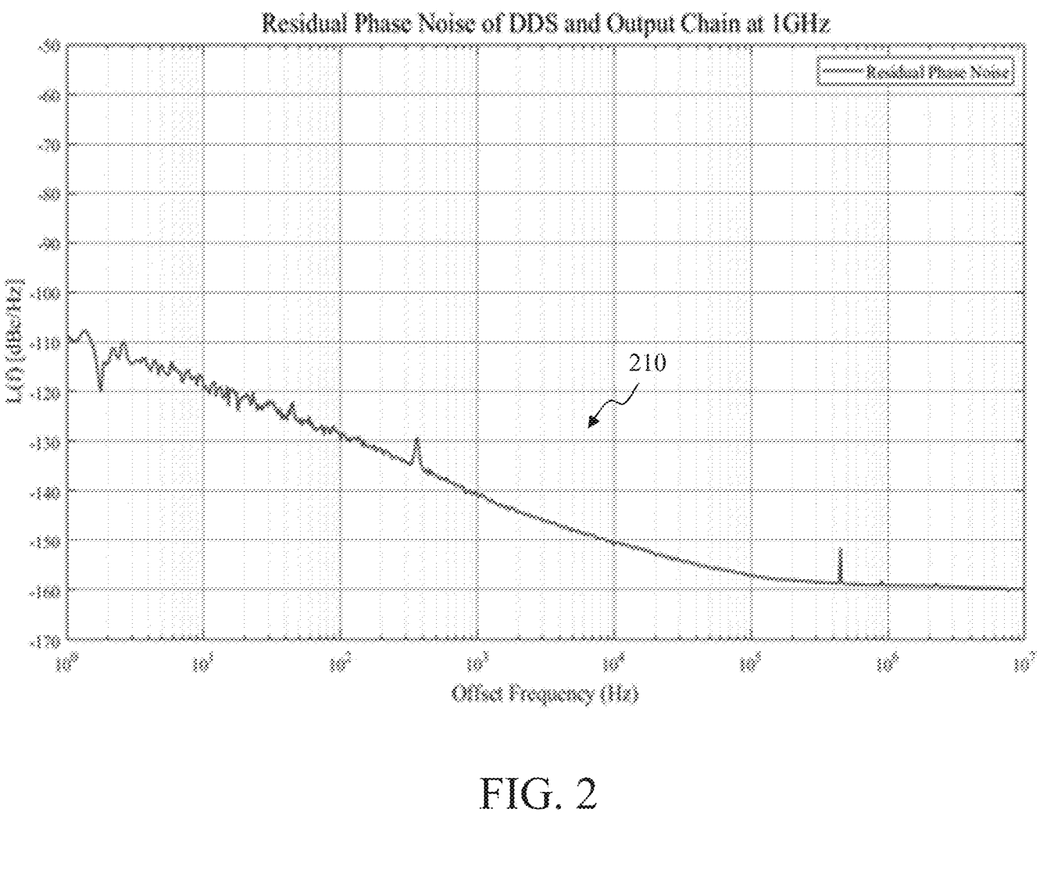
FIG. 2 is a plot of illustrative combined residual phase noise of a DDS signal source and output chain.

FIG. 2 is a plot of illustrative combined residual phase noise of a DDS signal source and output chain. In FIG. 2, the residual phase noise of the signal source 121 (e.g., DDS signal source) and the output chain 131 have been grouped together since they both consist of flicker noise and thermal noise. Ideally, the flicker noise of the output chain 131 is lower than the flicker noise of the signal source 121. Generally, as shown by trace 210, the residual phase noise decreases as the offset frequency from the carrier of the signal generated by the DDS signal source increases.

Figure 3:
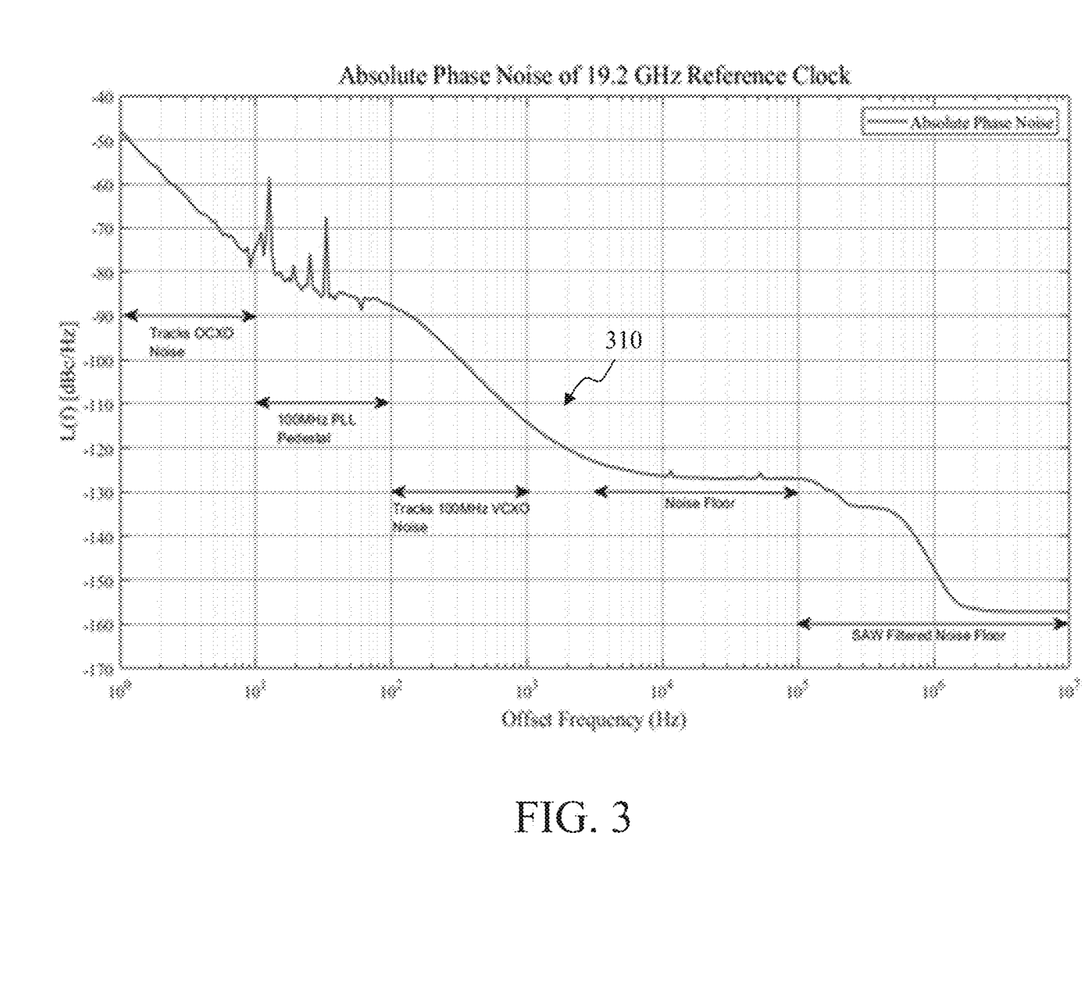
FIG. 3 is a plot of illustrative absolute phase noise of 19.2 GHz clock signal output by a clock reference system for a DDS signal source.

FIG. 3 is a plot of illustrative absolute phase noise of a 19.2 GHz clock signal output by the clock reference system 110 for a DDS signal source, for example. In FIG. 3, the absolute phase noise of the 19.2 GHz clock signal is shown by trace 310, which generally decreases as the offset from the carrier of the 19.2 GHz clock signal increases. The clock reference system 110 includes a reference source that is phase and frequency locked to a stable time base, such as a phase locked loop (PLL) reference signal generator, discussed below. For example, the clock signal output by the clock reference system 110 may be derived from a 100 MHz PLL that is locked to a temperature stabilized time base. Frequency multiplication is then used to achieve the desired clock frequency of the clock signal, which is 19.2 GHz in the example shown in FIG. 3.

Referring to FIG. 3, the absolute phase noise tracks the noise of an oven-controlled quartz crystal oscillator (OCXO) up to approximately 10 Hz offset frequency. The 100 MHz PLL pedestal dominates between about 10 Hz and 100 Hz frequency offset, and the noise of a 100 MHz voltage controlled oscillator (VCO) dominates in the 100 MHz PLL reference signal generator between about 100 Hz and 1 kHz offset frequency. Thus, below the frequency offset of 1 kHz, the shape of the reference clock absolute phase noise is dominated by the 100 MHz PLL. The absolute phase noise beyond 1 kHz offset frequency is set by the noise floor of the 100 MHz PLL and the multiplier chain. That is, the absolute phase noise tracks the noise floor of the 100 MHz PLL between about 1 kHz and 100 kHz offset frequency, and tracks the noise floor of surface acoustic wave (SAW) filters in the multiplier chain between about 100 kHz and 10 MHz offset frequency, where the bandpass filters are used to filter noise. The overall noise profile of the signal generator 120 becomes the root sum of squares (RSS) of the residual phase noise of the signal source 121 and the output chain 131, and the absolute phase noise of the scaled down clock signal from the clock reference system 110.

Notably, the lowest cutoff frequency for commercially available SAW filters, for example, is approximately 100 kHz. Therefore, the noise floor of the multiplier chain in the clock reference system 110 may be filtered beyond a 100 kHz offset frequency. That is, inclusion of the SAW filters improves the overall phase noise of the clock reference system 110 beyond 100 kHz. Also, a phase noise pedestal may be artificially formed at different levels from about 1 kHz to 100 kHz offset frequency by degrading the noise floor of the multiplier chain prior to passing through the SAW filters. This is because the degraded noise floor of the multiplier chain will be dominant before the SAW filter cutoff at 100 kHz, and any noise beyond the cutoff frequency will be removed. The resultant phase noise will take the shape of a pedestal between about the 1 kHz and 100 kHz offset frequencies. Significantly, the phase noise pedestal formed in the noise floor of the clock reference system 110 will be passed to the signal generator 120 driven by the clock reference system 110, and therefore will be included in the signal ultimately output by the signal generator 120.

Figure 4:
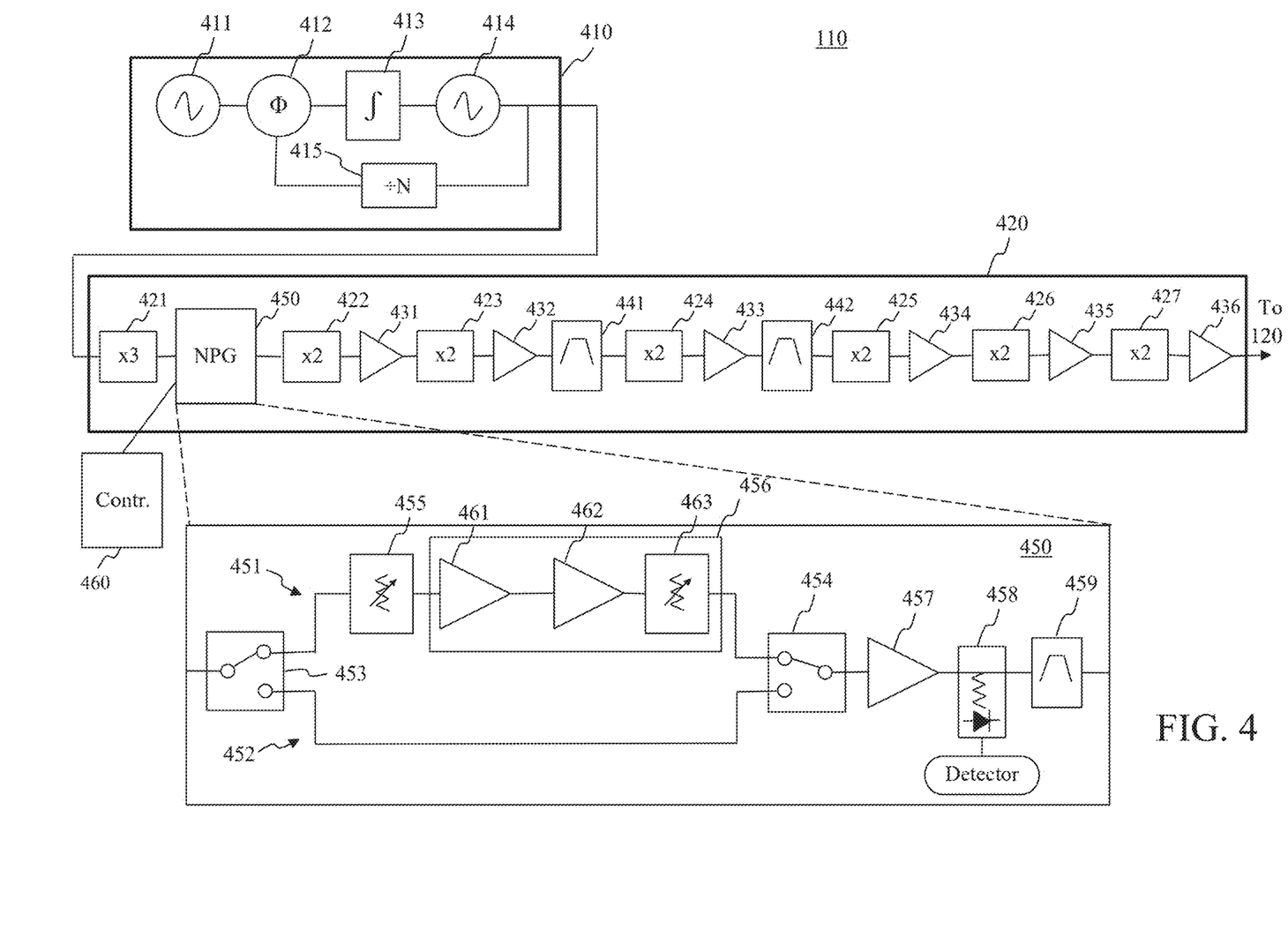
FIG. 4 is a simplified block diagram of a reference system for generating a clock signal with a tunable noise pedestal, according to a representative embodiment.

FIG. 4 is a simplified block diagram of a clock reference system for generating a clock signal with a tunable noise pedestal, according to a representative embodiment. The clock signal drives a signal generator configured to generate a signal, which includes a noise pedestal that corresponds to the tunable noise pedestal in the clock signal.

Referring to FIG. 4, clock reference system 110 includes a reference source 410 and a multiplier chain 420. The reference source 410 is configured to generate a reference signal having a first frequency. The multiplier chain 420 is configured to multiply the reference signal output by the reference source 410 to produce a clock signal having a second frequency greater than the first frequency, and to output the clock signal to a signal generator, such as the signal generator 120. The first frequency of the reference signal output by the reference source 410 may be 100 MHz, for example, and the second frequency to which the first frequency is multiplied by the multiplier chain 420 may be 19.2 GHz, for example, although other first and second frequencies may be implemented without departing from the scope of the present teachings. The depicted embodiment of the clock reference system 110 allows for degradation of the noise floor of the multiplier chain 420, discussed below, in order to introduce a tunable phase noise pedestal to the overall response of the clock reference system 110, and subsequently to the overall response of the signal generator 120 driven by the clock reference system 110.

The reference source 410 may be a 100 MHz reference PLL, for example. The reference source 410 may include a quartz crystal oscillator 411, a phase detector 412, an integrator 413, and a voltage controlled oscillator (VCO) 414 connected in series. The quartz crystal oscillator 411 may be an oven-controlled crystal oscillator (OCXO), for example, configured to generate a 10 MHz signal. The VCO 414 is configured to generate the 100 MHz reference signal, which is input to the multiplier chain 420, as well as fed back to the phase detector 412 through a divider 415 in a feedback loop. The divider 415 divides the 100 MHz reference signal by N or N·f to provide the feedback signal, where N is an integer portion of a division ratio, and f is the fractional portion of the division ratio. For example, if N·f is 3.2, then N=3 and f=2. The feedback signal is input to the phase detector 412, which determines a phase difference between phases of the feedback signal and the 10 MHz signal from the quartz crystal oscillator 411. The integrator 413 accumulates the phase error and outputs a corresponding integral voltage that drives the VCO 414 to generate the 100 MHz reference signal. In this manner, the reference source 410 provides a phase locked 100 MHz (first frequency) reference signal to the multiplier chain 420.

The multiplier chain 420 includes a first multiplier 421 connected in series with a noise pedestal generator (NPG) 450. The first multiplier 421 is configured to receive the 100 MHz reference signal from the reference source 410 and to multiply the reference signal to an intermediate frequency, which is at least the minimum frequency that the noise pedestal generator 450 is able to process. For example, in the depicted embodiment, the noise pedestal generator 450 includes a bandpass filter 459, discussed below, which may be a 300 MHz surface acoustic wave (SAW) filter, for example. Thus, the first multiplier 421 would be a three-times (3x) frequency multiplier (tripler), so that the intermediate frequency of the reference signal matches the 300 MHz SAW filter. In alternative configurations, the first multiplier 421 may not be needed, in which case the NPG 450 receives the 100 MHz reference signal directly from the reference source 410. Although the NPG 450 is shown as part of the multiplier chain 420, it may be considered as being connected to the multiplier chain 420 without departing from the scope of the present teachings.

For ease of explanation, the various components of the noise pedestal generator 450 are shown in expanded form, indicated by dashed lines in FIG. 4. The noise pedestal generator 450 is configured to selectively add a noise pedestal to the reference signal at the intermediate frequency. That is, the noise pedestal generator 450 includes a switch arrangement that enables selection of a first path 451 configured to add the noise pedestal to the reference signal or a second path 452 configured to bypass the addition of the noise pedestal. The second path 452 may be a cable or other conductor, for example, and may include a fixed attenuator for passive signal conditioning. The switch arrangement provides flexibility to the user, since it enables the same clock reference system 110 to be used to drive the signal generator 120 to generate signals with or without noise pedestals. Also, the first path 451 may provide different noise levels of the noise pedestal when selected, as discussed below, providing additional flexibility to the user.

In the depicted embodiment, the switch arrangement includes a first switch 453 configured to selectively connect an input of the selected one of the first path 451 or the second path 452 to the output of the reference source 410 (via the first multiplier 421), and a second switch 454 configured to selectively connect an output of the selected one of the first path 451 or the second path 452 to the bandpass filter 459 (via low noise amplifier (LNA) 447 and frequency detector 448, discussed below). For purposes of illustration, the first and second switches 453 and 454 are shown as single pole double through switches, for example, although other types of switches may be incorporated without departing from the scope of the present teachings. For purposes of illustration, both of the first and second switches 453 and 454 are shown in a first position for connecting the first path 451. The first and second switches 453 and 454 may be switched to a second position for connecting to the second path 452.

Operation of the first and second switches 453 and 454 may be controlled by a digital controller 460, such as a field programmable gate array (FPGA), for example, which outputs a control signal in response to input by the user or an automated test procedure executed by the controller. The selected path may be chosen during system calibration, for example. The term "controller" broadly encompasses all structural configurations, as understood in the art of the present disclosure, of an application specific main board or an application specific integrated circuit for controlling application of various principles as described in the present disclosure. The structural configuration of the controller may include, but is not limited to, processor(s), non-transitory computer-usable/computer readable storage medium(s), an operating system, application module(s), peripheral device controller(s), slot(s) and port(s), as well as a display and user interface.

The processor(s) may be implemented by a general purpose computer, a central processing unit, one or more processors, microprocessors or microcontrollers, a state machine, a programmable logic device, FPGAs, ASICs, or combinations thereof, using any combination of hardware, software, firmware, hard-wired logic circuits, or combinations thereof. The non-transitory computer-usable/computer readable storage medium(s) may be implemented by any number, type and combination of random access memory (RAM) and read-only memory (ROM), for example, and may store various types of information, such as software algorithms, data based models including neural network based models, and computer programs, all of which are executable by the processor(s). The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art.

The controller 460 may also include a display and a user interface (not shown) for interacting with a user. The display may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display includes a screen for viewing images of graphs, such as absolute and residual phase noise, for example, as well as a graphical user interface (GUI) (optional) to enable the user to interact with the displayed images and features. The user interface may receive input from the user to be provided to the controller 460, and to receive information and data output by the controller 460. All or a portion of the user interface may be implemented by a GUI viewable on the display, discussed above. The user interface may include one or more of a mouse, a keyboard, a trackball, a joystick, a microphone, a touchpad, a touchscreen, voice and/or gesture recognition captured by a microphone or video camera, for example.

The first path 451 includes a noise pedestal attenuator 455 and a variable gain amplifier (VGA) 456 connected in series. The noise pedestal attenuator 455 is configured to attenuate the reference signal received from the reference source 410 in order to degrade the noise floor of the reference signal. The noise pedestal attenuator 455 may be a digital step attenuator (DSA) or a variable voltage attenuator, for example. The noise pedestal attenuator 455 is adjustable, so that the reference signal may be attenuated by different amounts, which in turn dictates the noise level of the noise pedestal added to the reference signal. For example, increasing the attenuation of the noise pedestal attenuator 455 may degrade the noise floor of the reference signal at 300 MHz by discrete steps that depend on resolution of the noise pedestal attenuator 455. For example, the discrete steps may be as small as 0.1 dB. The noise floor will degrade dB per dB with the setting of the noise pedestal attenuator 455. For example, as discussed below with reference to FIG. 5, setting the noise pedestal attenuator 455 to 7 dB results in a first noise level of about −115 dBc/Hz, setting the noise pedestal attenuator 455 to 13 dB results in a second noise level of about −110 dBc/Hz, and setting the noise pedestal attenuator 455 to 24 dB results in a noise level of about −98 dBc/Hz. The distance between the first and third noise levels may be considered the tuning range of the noise pedestal generator 450. The noise pedestal attenuator 455 is adjusted to the noise level by the controller 460, for example.

The VGA 456 is configured to adjust the attenuated reference signal received from the noise pedestal attenuator 455 to account for the attenuation introduced by the noise pedestal attenuator 455, restoring a desired signal level to drive the remainder of the multiplier chain 420 optimally. That is, the VGA 456 outputs an adjusted reference signal at the desired signal level, which drives the remainder of the multiplier chain 420 at a target power, while maintaining the degraded noise floor of the pedestal. The VGA 456 essentially undoes the signal attenuation incurred by the carrier, while leaving the noise floor degradation introduced by the noise pedestal attenuator 455 largely unperturbed. The VGA 456 includes a cascade of amplifiers, indicated by representative LNA amplifier 461 and representative power amplifier 462, which are configured to amplify the attenuated reference signal, providing the required gain and output power. The VGA 456 further includes a VGA DSA 463 configured to adjust the amplified adjusted reference signal to the desired signal level, such that the adjusted reference signal is output from the first path 451 at the desired signal level.

The output of the first path 451 (adjusted reference signal) or the second path 452 (unadjusted reference signal) is selected at the second switch 454. NPG LNA 457 is provided to amplify the unadjusted reference signal, in particular, to achieve the desired signal level for driving the remainder of the multiplier chain 420 at the target power when the second path 452 has been selected. The output of the first path 451 should already be at the desired signal level, as discussed above. The reference signal is input to power detector 458, which is configured to monitor power at the corresponding frequency (e.g., 300 MHz) for determining that the signal level is at the target power. The power detector 458 outputs a voltage corresponding to the detected power, which is then used to tune the VGA 456 to the appropriate value, so that the signal level of the reference signal is at the target power. Alternatively, the VGA 456 may be tuned manually to the appropriate value by the user based on displayed output from the power detector 458, or as part of a control loop.

Following the power detector 458, the reference is input to the bandpass filter 459, which is configured to filter out excess noise. The filtering by the bandpass filter 459 results in formation of the noise pedestal at the noise level set by the noise pedestal attenuator 455. The bandpass filter 459 may be any compatible bandpass filter, such as a SAW filter, a bulk acoustic wave (BAW) filter, thin-film bulk acoustic resonator (FBAR) filter, or a ceramic filter, for example. In an embodiment, the bandpass filter 459 may be a 300 MHz SAW filter, through which the degraded noise floor passes, and which filters out excess noise beyond the cutoff of the SAW (e.g., 100 kHz). The resultant phase noise takes the shape of a pedestal. A pedestal is formed whether the reference signal is received at the bandpass filter 459 from the first path 451 or the second path 452, although the pedestal is larger and controlled when received from the first path 451.

The adjusted reference signal with the degraded noise pedestal or the unadjusted reference signal without the degraded noise pedestal (collectively referred to as the reference signal) is output from the bandpass filter 459 of the noise pedestal generator 450 to the remainder of the multiplier chain 420 for additional frequency multiplication and filtering to ultimately provide the clock signal at 19.2 GHz (second frequency). In the depicted embodiment, the remainder of the multiplier chain 420 includes, in series, a second multiplier 422, a first low noise amplifier (LNA) 431, a third multiplier 423, a second LNA 432, a first bandpass filter 441, a fourth multiplier 424, a third LNA 433, a second bandpass filter 442, a fifth multiplier 425, a fourth LNA 434, sixth multiplier 426, a firth LNA 435, and seventh multiplier 427, and a sixth LNA 436. Each of the second through seventh multipliers 422-427 is a two-times (2x) frequency multiplier (doubler). The second through seventh multipliers 422-427 are respectively followed by the first through sixth LNAs 431-436, which are configured to amplify the reference signal following each incremental increase in frequency. The first and second bandpass filters 441 and 442 may also be SAW filters, for example, and are configured to filter noise from amplified reference signal. The number and locations of the bandpass filters may vary to provide unique benefits for any particular situation or to meet application specific design requirements of various implementations, as would be apparent to one skilled in the art. The resulting 19.2 GHz clock signal is output to the signal generator 120.

Figure 5:
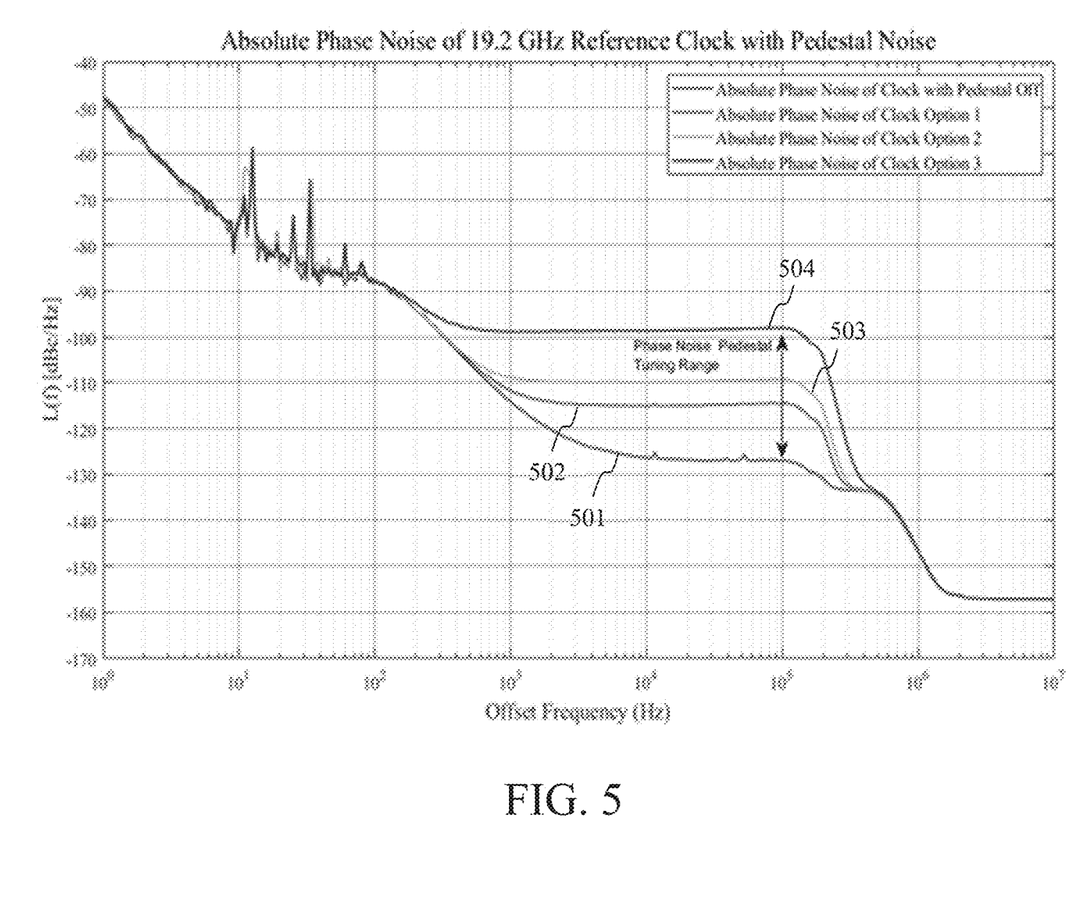
FIG. 5 is a plot of illustrative absolute phase noise of 19.2 GHz clock signal output by a clock reference system, according to an illustrative embodiment.
Figure 6:
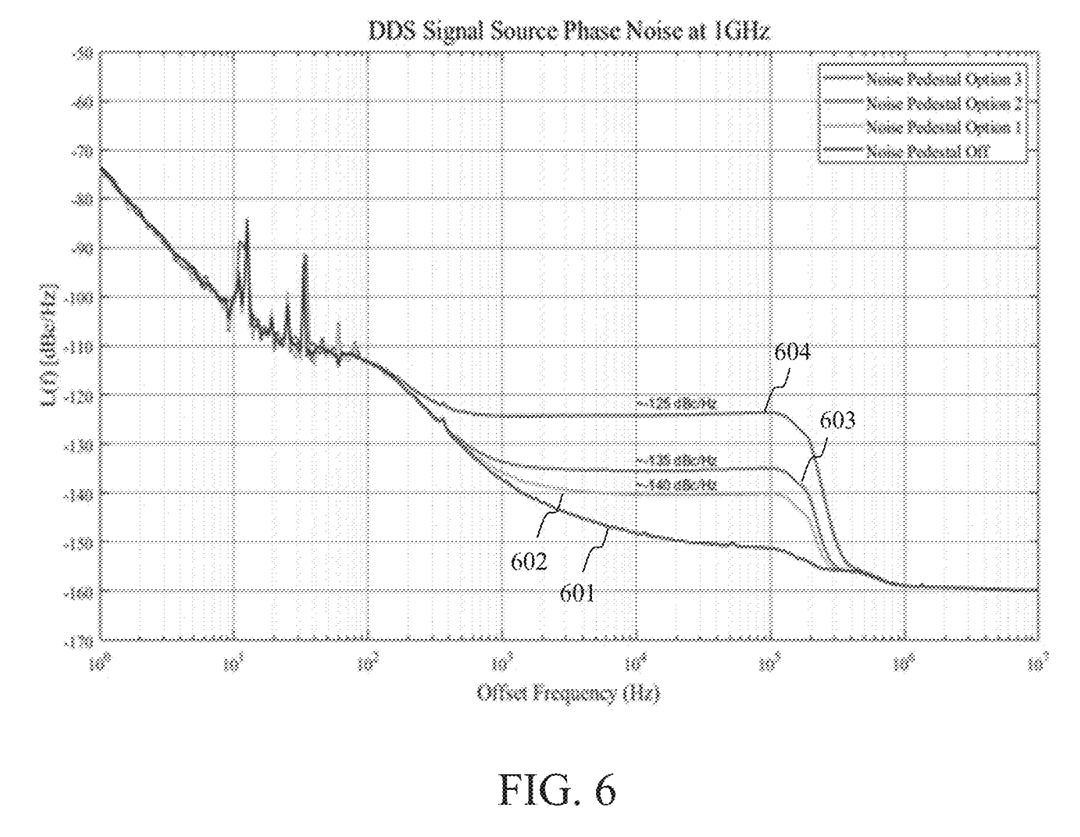
FIG. 6 is a plot of illustrative phase noise of a DDS signal source and output chain in response to the 19.2 GHz clock signal output by the clock reference system, according to an illustrative embodiment.

FIG. 5 is a plot of illustrative absolute phase noise of 19.2 GHz clock signal output by a clock reference system, according to an illustrative embodiment. FIG. 6 is a plot of illustrative phase noise of a DDS signal source and output chain in response to the 19.2 GHz clock signal output by the clock reference system shown in FIG. 5, according to an illustrative embodiment.

Referring to FIG. 5, trace 501 shows the absolute phase noise of the 19.2 GHz clock signal output by the clock reference system 110 without a degraded noise pedestal, in response to selection of the second path 452 of the noise pedestal generator 450, bypassing the noise pedestal attenuator 455 and the VGA 456. Traces 502, 503 and 504 show the absolute phase noise of the 19.2 GHz clock signal output by the clock reference system 110 with noise pedestals at different noise levels, in response to selection of the first path 451 of the noise pedestal generator 450. The different noise levels are set by adjusting the noise pedestal attenuator 455 to different attenuations, as discussed above.

In particular, the trace 501 shows a noise floor of about −128 dBc/Hz between about 10 kHz and 100 kHz offset frequency, which equates to no noise pedestal degradation in the clock signal. When a DDS signal generator, for example, is driven by the clock signal with no degraded noise pedestal, the resulting output signal generated the DDS signal generator likewise has no degraded noise pedestal. The trace 502 shows a noise pedestal with a noise level of about −115 dBc/Hz between about 10 kHz and 100 kHz offset frequency. The trace 503 shows a noise pedestal with a noise level of about −110 dBc/Hz between about 10 kHz and 100 kHz offset frequency. The trace 504 shows a noise pedestal with a noise level of about −98 dBc/Hz between about 10 kHz and 100 kHz offset frequency. At about 100 kHz, the bandpass filter 459 takes effect to provide the pedestal shape by filtering excess noise to about −158 dBc/Hz. When a DDS signal generator, for example, is driven by the clock signal with a degraded noise pedestal, the resulting output signal generated the DDS signal generator likewise has a degraded noise pedestal, as discussed below.

Referring to FIG. 6, trace 601 shows phase noise of about −150 dBc/Hz at a 100 kHz offset frequency, which equates to no noise pedestal in the signal generated by the DDS signal generator, in response to being driven by the clock signal having no pedestal as shown by the trace 501. When a noise pedestal is present in the clock signal, it becomes the dominant noise contributor from about 10 kHz to 100 kHz of offset frequency, as shown by traces 602-604. Trace 602 shows a noise pedestal with a noise level of about −140 dBc/Hz between about 10 kHz and 100 kHz offset frequency in response to being driven by the clock signal having the noise pedestal as shown by the trace 502. Trace 603 shows a noise pedestal with a noise level of about −135 dBc/Hz between about 10 kHz and 100 kHz offset frequency in response to being driven by the clock signal having the noise pedestal as shown by the trace 503. Trace 604 shows a noise pedestal with a noise level of about −125 dBc/Hz between about 10 kHz and 100 kHz offset frequency in response to being driven by the clock signal having the noise pedestal as shown by the trace 504. In other words, the noise pedestals added to the clock signals output by the clock reference system 110 are effectively translated into corresponding noise pedestals in the signals generated by the signal generated being driven by these clock signals.

Therefore, in accordance with the embodiments, there is no need for processing and computing resources to execute complex algorithms in order to add simulated noise pedestals to signals generated by a signal generator. Rather, the noise pedestals are added to the generated signals simply in response to the noise pedestals previously added to the clock signals by the noise pedestal generator 450 in the clock reference system 110. Also, the noise pedestals in the generated output signals may be easily scaled by simply adjusting noise levels of the noise pedestals in the reference signals at the noise pedestal generator 450.

Figure 7:
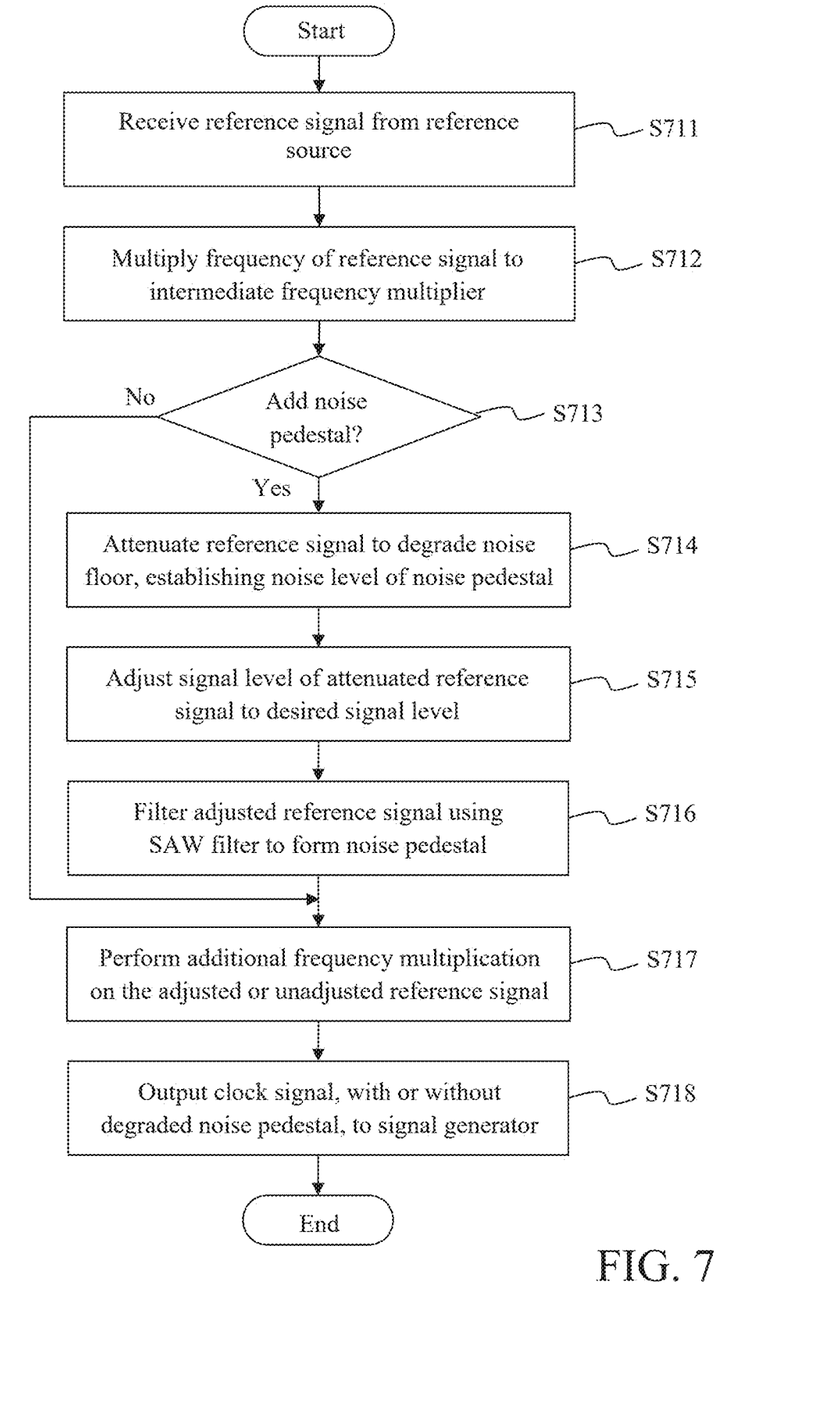
FIG. 7 is a flow diagram showing a method of generating a clock signal with a tunable noise pedestal for driving a signal generator, according to a representative embodiment.

FIG. 7 is a flow diagram showing a method of generating a clock signal with a tunable noise pedestal for driving a signal generator, according to a representative embodiment. The steps in FIG. 7 may be implemented using the clock reference system 110 of the signal generating system 100, discussed above.

Referring to FIG. 7, a reference signal is received at block S711 from a stable reference source, such as a PLL reference source. The reference signal has a first frequency (e.g., 100 MHz)

In block S712, the reference signal is multiplied by a frequency multiplier in order to increase the first frequency to an intermediate frequency (e.g., 300 MHz). The intermediate frequency is at least the minimum frequency at which a SAW filter, for example, is able to operate.

In block S713, a determination is made regarding whether a noise pedestal is to be added to the reference signal, and ultimately to the clock signal output to the signal generator. The determination may be made by operation of a switch arrangement selecting one of two paths: a first path for adding the noise pedestal to the reference signal and a second path bypassing the addition of the noise pedestal to the reference signal, as discussed above.

When it is determined that no noise pedestal is to be added to the reference signal (block S713: No), the process proceeds to block S717 where additional frequency multiplication is performed on the reference signal (with no noise pedestal) to provide the clock signal at a second frequency (e.g., 19.2 GHz) higher than the first frequency and the intermediate frequency.

When it is determined that a noise pedestal is to be added to the reference signal (block S713: Yes), the process proceeds to block S714 where the reference signal is attenuated in order to degrade the noise floor of the reference signal, thereby establishing a noise level of the noise pedestal. The reference signal may be attenuated using any compatible attenuator, such as a DSA or variable voltage attenuator, for example. The amount of attenuation may be adjustable so that different noise levels of the noise pedestal may be provided to the reference signal.

In block S715, the signal level (power) of the attenuated reference signal is adjusted to a desired signal level to provide an adjusted reference signal. The adjusted reference signal is able to drive a subsequent multiplier chain at a target power, while maintaining the degraded noise floor established in block S714. The signal level of the adjusted reference signal may be adjusted using a VGA connected in series with the DSA.

In block S716, the adjusted reference signal is filtered using a bandpass filter, in order to filter out excess noise from the adjusted reference signal. The filtering forms the noise pedestal by effectively removing noise above a predetermined cutoff of the offset frequency (e.g., 100 kHz) from a carrier of the adjusted reference signal.

In block S717, additional frequency multiplication is performed on the adjusted reference signal with a noise pedestal from block S716 or on an unadjusted reference signal with no noise pedestal from block S713 (discussed above) to provide the clock signal at the second frequency (e.g., 19.2 GHz). The second frequency is higher than the first frequency and the intermediate frequency, and is the frequency of the clock signal output by the clock reference system (e.g., clock reference system 110) for driving the signal generator (e.g., signal generator 120).

In block S718, the clock signal, which includes the noise pedestal from the adjusted reference signal or includes no noise pedestal from the unadjusted reference signal, is output to the signal generator for driving the signal generator, which improves operation and versatility of the signal generator. The presence or absence of the noise pedestal in the clock signal is translated to the signal ultimately generated by the signal generator. When the noise pedestal is included in the clock signal, the magnitude (noise level) of the noise pedestal is likewise translated to the signal ultimately generated by the signal generator. The clock signal may be used to drive the signal generator for a variety of purposes. For example, the signal generated by the signal generator in response to the clock signal may be displayed and used for calibrating and/or testing the signal generator. The signal also may be applied to a device under test (DUT) by the signal generator for calibrating and/or testing the DUT. The clock signal may also be used for driving the signal generator to emulate communication or Radar systems, for example.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A reference system for generating a clock signal with a tunable noise pedestal for driving a signal generator, the reference system comprising:
   a reference source configured to generate a reference signal having a first frequency; and
   a multiplier chain configured to multiply the reference signal to produce a clock signal having a second frequency greater than the first frequency, and to output the clock signal to the signal generator, wherein the multiplier chain comprises:
   a noise pedestal generator configured to selectively form a noise pedestal in the reference signal, wherein the noise pedestal generator comprises:
      a noise pedestal attenuator configured to attenuate the reference signal to degrade a noise floor of the reference signal;
      a variable gain amplifier (VGA) configured to adjust the attenuated reference signal to a desired signal level to provide an adjusted reference signal able to drive a remainder of the multiplier chain at a target power, while maintaining the degraded noise floor;
      a bandpass filter configured to filter out excess noise from the adjusted reference signal to form the noise pedestal; and
      a switch arrangement configured to selectively input the reference signal to a first path including the noise pedestal attenuator and the VGA, and a second path bypassing the noise pedestal attenuator and the VGA,
   wherein the clock signal, which is output to the signal generator, is based on the adjusted reference signal including the noise pedestal when the switch arrangement selectively inputs the reference signal to the first path, and the clock signal is based on the reference signal without the noise pedestal when the switch arrangement selectively inputs the reference signal to the second path.

2. The reference system of claim 1, wherein the VGA comprises:
   a plurality of amplifiers configured to amplify the attenuated reference signal; and
   a VGA digital step attenuator (DSA) configured to adjust the amplified attenuated reference signal to the desired signal level to output the adjusted reference signal at the desired signal level.

3. The reference system of claim 1, wherein the noise pedestal generator further comprises:
   a low noise amplifier (LNA) configured to amplify the adjusted reference signal output by the VGA; and
   a power detector configured to monitor power of the amplified adjusted reference signal for determining that the desired signal level is at the target power.

4. The reference system of claim 1, wherein the switch arrangement comprises:
   a first switch configured to selectively connect an input of a selected one of the first and second paths to the reference source; and
   a second switch configured to selectively connect an output of the selected one of the first and second paths to the bandpass filter.

5. The reference system of claim 1, wherein the noise pedestal attenuator comprises a digital step attenuator.

6. The reference system of claim 1, wherein the noise pedestal attenuator comprises a voltage variable attenuator.

7. The reference system of claim 1, wherein the bandpass filter comprises a surface acoustic wave (SAW) filter.

8. The reference system of claim 1, wherein the noise pedestal attenuator is configured to attenuate the reference signal at 300 MHz in discrete steps.

9. The reference system of claim 1, wherein the bandpass filter is configured to filter out excess noise of the noise pedestal generator at 300 MHz.

10. The reference system of claim 1, wherein the reference source comprises a phase locked loop (PLL).

11. The reference system of claim 1, wherein the multiplier chain further comprises:

at least one multiplier connected in series between the reference source and the noise pedestal generator, and configured to multiply the first frequency to an intermediate frequency that is greater than the first frequency and within a filter range of the bandpass filter.

12. The reference system of claim 11, wherein the multiplier chain further comprises:
a plurality of multipliers connected in series after the bandpass filter for incrementally multiplying the adjusted reference signal from the intermediate frequency to the second frequency; and
a plurality of LNAs and additional bandpass filters connected in series following the plurality of multipliers, respectively.

13. A reference system for generating a clock signal with a tunable noise pedestal for driving a signal generator, the reference system comprising:
a reference source configured to generate a reference signal having a first frequency; and
a noise pedestal generator configured to selectively form a noise pedestal in the reference signal, wherein the noise pedestal generator comprises:
a noise pedestal attenuator configured to attenuate the reference signal to degrade a noise floor of the reference signal;
a variable gain amplifier (VGA) configured to adjust the attenuated reference signal to a desired signal level to provide an adjusted reference signal able to drive a multiplier chain at a target power, while maintaining the degraded noise floor;
a bandpass filter configured to filter out excess noise from the adjusted reference signal to form the noise pedestal; and
a switch arrangement configured to selectively input the reference signal to a first path including the noise pedestal attenuator and the VGA, and a second path bypassing the noise pedestal attenuator and the VGA, and to selectively output one of the adjusted reference signal from the first path and the reference signal from the second path to the signal generator, wherein the adjusted reference signal includes the noise pedestal; and
a controller configured to control the switch arrangement to select one of the first path or the second path.

14. The reference system of claim 13, further comprising:
the multiplier chain configured to multiply the selected one of the adjusted reference signal or the reference signal to produce a clock signal having a second frequency greater than the first frequency.

15. The reference system of claim 13, wherein the VGA comprises:
a plurality of amplifiers configured to amplify the attenuated reference signal; and
a VGA digital step attenuator (DSA) configured to adjust the amplified attenuated reference signal to the desired signal level to output the adjusted reference signal at the desired signal level.

16. The reference system of claim 13, wherein the noise pedestal generator further comprises:
a low noise amplifier (LNA) configured to amplify the adjusted reference signal output by the VGA; and a power detector configured to monitor power of the amplified adjusted reference signal for determining that the desired signal level is at the target power.

17. The reference system of claim 13, wherein the switch arrangement comprises:
a first switch configured to selectively connect an input of a selected one of the first and second paths to the reference source; and
a second switch configured to selectively connect an output of the selected one of the first and second paths to the bandpass filter.

18. The reference system of claim 17, wherein the noise pedestal attenuator comprises a digital step attenuator or a voltage variable attenuator.

19. The reference system of claim 17, further comprising:
at least one multiplier connected in series between the reference source and the noise pedestal generator, and configured to multiply the first frequency to an intermediate frequency that is greater than the first frequency and within a filter range of the bandpass filter.

20. A signal generating system, comprising:
a clock reference system configured to generate a clock signal with a tunable noise pedestal; and
a signal generator configured to generate a radio frequency (RF) signal responsive to the clock signal from the clock reference system, the RF signal including the tunable noise pedestal from the clock signal,
wherein the clock reference system comprises:
a reference source configured to generate a reference signal having a first frequency; and
a multiplier chain configured to multiply the reference signal to produce the clock signal having a second frequency greater than the first frequency, wherein the multiplier chain comprises:
a noise pedestal generator configured to selectively form a noise pedestal in the reference signal, wherein the noise pedestal generator comprises:
a noise pedestal attenuator configured to attenuate the reference signal to degrade a noise floor of the reference signal;
a variable gain amplifier (VGA) configured to adjust the attenuated reference signal to a desired signal level to provide an adjusted reference signal able to drive a remainder of the multiplier chain at a target power, while maintaining the degraded noise floor;
a bandpass filter configured to filter out excess noise from the adjusted reference signal to form the noise pedestal; and
a switch arrangement configured to selectively input the reference signal to a first path including the noise pedestal attenuator and the VGA, and a second path bypassing the noise pedestal attenuator and the VGA,
wherein the clock signal is based on the adjusted reference signal including the noise pedestal when the switch arrangement selectively inputs the reference signal to the first path, and the clock signal is based on the reference signal without the noise pedestal when the switch arrangement selectively inputs the reference signal to the second path.

* * * * *